(12) United States Patent
Sakamoto (10) Patent No.: US 10,559,775 B2
(45) Date of Patent: Feb. 11, 2020

(54) ORGANIC EL DISPLAY DEVICE

(71) Applicant: Japan Display Inc., Minato-ku (JP)

(72) Inventor: Asami Sakamoto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/220,059

(22) Filed: Dec. 14, 2018

(65) Prior Publication Data

US 2019/0189955 A1    Jun. 20, 2019

(30) Foreign Application Priority Data

Dec. 18, 2017 (JP) .................. 2017-241640

(51) Int. Cl.

| | |
|---|---|
| *H01L 51/52* | (2006.01) |
| *H01L 51/50* | (2006.01) |
| *H01L 27/32* | (2006.01) |
| *G09G 3/3225* | (2016.01) |
| *H01L 51/56* | (2006.01) |
| *G09G 3/3266* | (2016.01) |

(52) U.S. Cl.
CPC ....... *H01L 51/5215* (2013.01); *G09G 3/3225* (2013.01); *G09G 3/3266* (2013.01); *H01L 27/3246* (2013.01); *H01L 51/5056* (2013.01); *H01L 51/5088* (2013.01); *H01L 51/5209* (2013.01); *H01L 51/5234* (2013.01); *H01L 51/56* (2013.01); *H01L 51/5253* (2013.01)

(58) Field of Classification Search
CPC .......... H01L 27/3246; H01L 51/5209
See application file for complete search history.

(56) References Cited

U.S. PATENT DOCUMENTS

| | | | |
|---|---|---|---|
| 2012/0248475 A1* | 10/2012 | Yamada ................ | H01L 27/322 257/89 |
| 2015/0048328 A1 | 2/2015 | Kato et al. | |
| 2019/0096971 A1* | 3/2019 | Ukigaya ............. | H01L 27/3246 |

FOREIGN PATENT DOCUMENTS

| | | |
|---|---|---|
| JP | 2014-232631 | 12/2014 |
| JP | 2016-85796 | 5/2016 |
| JP | 2017-92213 | 5/2017 |

* cited by examiner

*Primary Examiner* — Raj R Gupta
(74) *Attorney, Agent, or Firm* — Oblon, McClelland, Maier & Neustadt, L.L.P.

(57) ABSTRACT

An organic EL display device according to an embodiment of the present invention includes: a base material; a plurality of pixels; a lower electrode which each of the plurality of pixels is provided with; an organic insulation layer which sections the plurality of pixels; an organic material layer which is disposed on the lower electrode and the organic insulation layer, and includes a plurality of layers; and an upper electrode on the organic material layer. A level difference part is positioned on an upper surface of the organic insulation layer, a first layer included in the organic material layer is divided at the level difference part, or has a thin part being thinner at the level difference part than at a position at which the first layer faces the lower electrode, and a second layer included in the organic material layer is not divided at the level difference part.

11 Claims, 6 Drawing Sheets

ORGANIC EL DISPLAY DEVICE

CROSS-REFERENCE TO RELATED APPLICATION

The present application claims priority from Japanese Application JP 2017-241640 filed on Dec. 18, 2017, the content of which is hereby incorporated by reference into this application.

BACKGROUND OF THE INVENTION

1. Field of the Invention

One or more embodiments of the present invention relate to an organic EL display device.

2. Description of the Related Art

Recent years, an image display device (hereinafter referred to as an "organic EL (electro-luminescent) display device") which uses a self-luminous body called an organic light emitting diode (OLED) is put into practical use. Since the organic EL display device uses a self-luminous body, as compared with, for example, a liquid crystal display device, it is not only superior with respect to visibility and a response speed, but moreover it can be formed thin as it does not need a lighting device such as a backlight.

An organic EL display device has a display panel where a thin film transistor (TFT), an organic light emitting diode (OLED), and the like are formed on a base material. The OLED is configured by disposing an organic material layer having a plurality of layers which includes a light emission layer and the like, between a pair of electrodes. The organic material layer is typically formed in an area surrounded by a bank which is provided in advance to mark boundaries of pixels. Here, for example, as disclosed in Japanese Patent Application Laid-Open No. 2016-085796 or Japanese Patent Application Laid-Open No. 2017-092213, there is a case where a layer constituting the organic material layer is shared in common by a plurality of pixels.

SUMMARY OF THE INVENTION

However, there is a problem that in a formation of the organic material layer having the plurality of layers, if some layers which constitute the organic material layer are provided over a plurality of pixels, a current leakage occurs. The leakage current does not contribute to a light emission of a pixel. Further, if a leakage current goes into an adjacent pixel, an unintended light emission of a pixel (color mixing) occurs. Meanwhile, in the case where a resolution is improved or in the case where an opening ratio of the bank as described above is increased in order to improve a light emission efficiency, there occurs a problem that a control is difficult when the organic material layer is formed one-by-one for (is separately applied to) each pixel.

Regarding the issue as described above, the object of an embodiment of the present invention is to provide an organic EL display device which suppresses a current leakage between pixels adjacent to one another.

According to one aspect of the present invention, an organic EL display device is provided. The organic EL display device includes: a base material; a plurality of pixels which are positioned on the base material; a lower electrode which each of the plurality of pixels is provided with; a bank which sections the plurality of pixels; an organic material layer which is disposed on the lower electrode and the bank, and includes a plurality of layers; and an upper electrode which is disposed on the organic material layer. A level difference part is positioned on an upper surface of the bank, some layer included in the organic material layer is divided at the level difference part, or has a thin part being thinner at the level difference part than at a position at which the some layer faces the lower electrode, and another layer included in the organic material layer which is different from the some layer is not divided.

DETAILED DESCRIPTION OF THE INVENTION

Below, each of the one or more embodiments of the present invention is explained with reference to the accompanying drawings. Note that the one or more disclosed embodiments are merely examples, and an appropriate variation which a person skilled in the art can easily arrive at without departing from the spirit of the present invention is naturally included in the scope of the present invention. Further, while width, thickness, shape, and the like of each part in the drawings may be illustrated schematically as compared with the actual embodiments in order to clarify the explanation, these are merely examples, and an interpretation of the present invention should not be limited thereto. Furthermore, in the specification and the respective drawings, the same reference symbols may be applied to elements similar to those which have already been shown in another drawing, and a detailed description of such elements may be omitted as appropriate.

Further, in the detailed description of the one or more embodiments of the present invention, when a positional relationship between one component and another component is defined, the words "on" and "under" are not used only in a case where the other component is positioned directly on or directly under the one component, but those words are also used in a case where still another component is interposed between the one component and the other component, unless otherwise stated.

Figure 1:
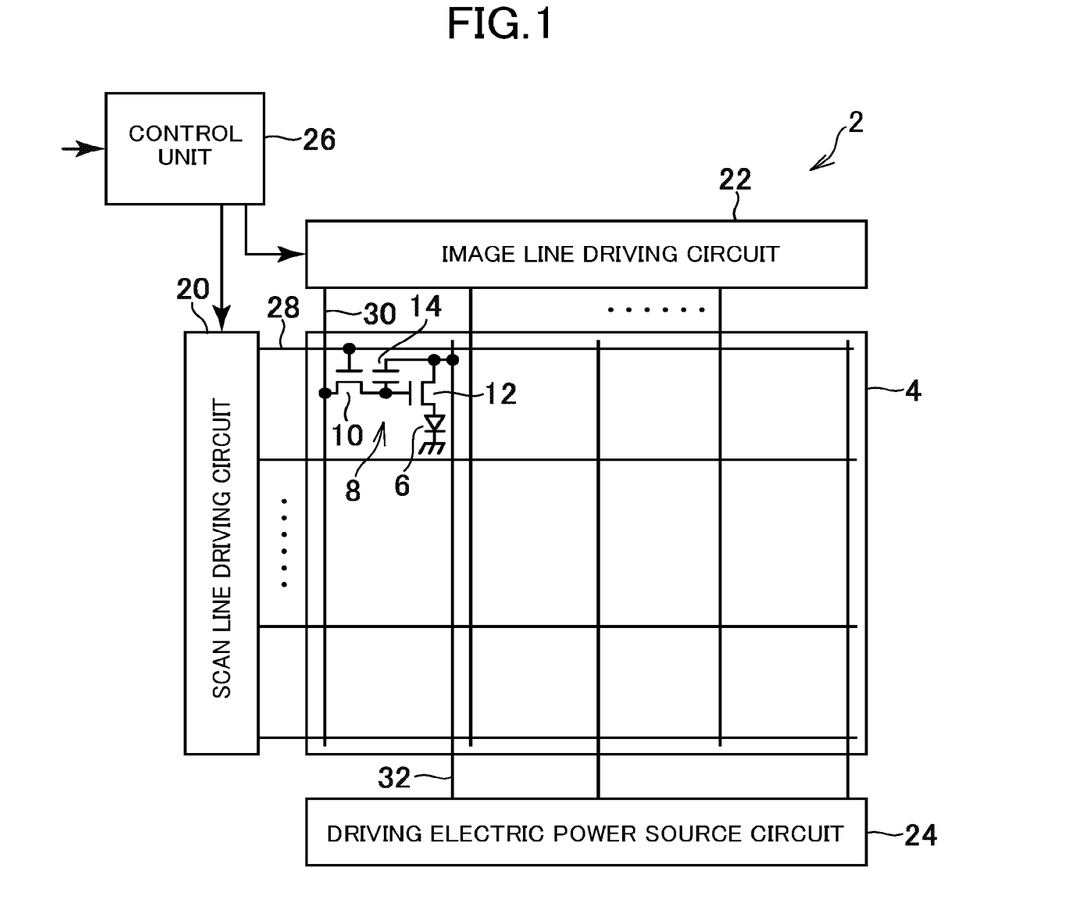
FIG. 1 is a schematic diagram which shows a schematic configuration of an organic EL display device according to one embodiment of the present invention.

FIG. 1 is a schematic diagram which shows a schematic configuration of an organic EL display device according to one embodiment of the present invention. An organic EL display device 2 is provided with a pixel array part 4 which displays an image, and a driving part which drives the pixel array part 4. The organic EL display device 2 is configured by forming a lamination structure such as a thin film transistor (TFT), an organic light emitting diode (OLED), and the like on a base material. Note that the schematic diagram shown in FIG. 1 is merely an example, and the present embodiment is not limited thereto.

In the pixel array part 4, OLEDs 6 and pixel circuits 8 are arranged in a matrix in correspondence with the pixels. A pixel circuit 8 is constituted by a plurality of TFTs 10 and 12, and a capacitor 14.

The driving part as described above includes a scan line driving circuit 20, an image line driving circuit 22, a driving electric power source circuit 24, and a control unit 26, and drives the pixel circuit 8 to control a light emission of an OLED 6.

The scan line driving circuit 20 is connected to a scan signal line 28 provided for each of horizontal arrays of pixels (pixel rows). The scan line driving circuit 20 selects scan signal lines 28 in order according to a timing signal input from the control unit 26, and applies, to the selected scan signal line 28, a voltage to turn on a lighting TFT 10.

The image line driving circuit 22 is connected to an image signal line 30 provided for each of vertical arrays of pixels (pixel columns). The image line driving circuit 22 receives an input of an image signal from the control unit 26, and outputs, to each image signal line 30, a voltage in accordance with an image signal of the selected pixel row so as to comply with the selection of the scan signal line 28 by the scan line driving circuit 20. The voltage is written into the capacitor 14 via the lighting TFT 10 in the selected pixel row. The driving TFT 12 supplies a current in accordance with the written voltage to the OLED 6, to thereby have the OLED 6 of the pixel corresponding to the selected scan signal line 28 emit light.

The driving electric power source circuit 24 is connected to a driving electric power source line 32 provided for each pixel column, and supplies a current to the OLED 6 via the driving electric power source line 32 and the driving TFT 12 of the selected pixel row.

Here, a lower electrode of the OLED 6 is connected to the driving TFT 12. On the other hand, an upper electrode of the respective OLEDs 6 is constituted by an electrode shared in common by the OLEDs 6 of all the pixels. In the case where the lower electrode is configured as an anode, a high electric potential is input thereto, and the upper electrode becomes a cathode and a low electric potential is input thereto. In the case where the lower electrode is configured as a cathode, a low electric potential is input thereto, and the upper electrode becomes an anode and a high electric potential is input thereto.

Figure 2:
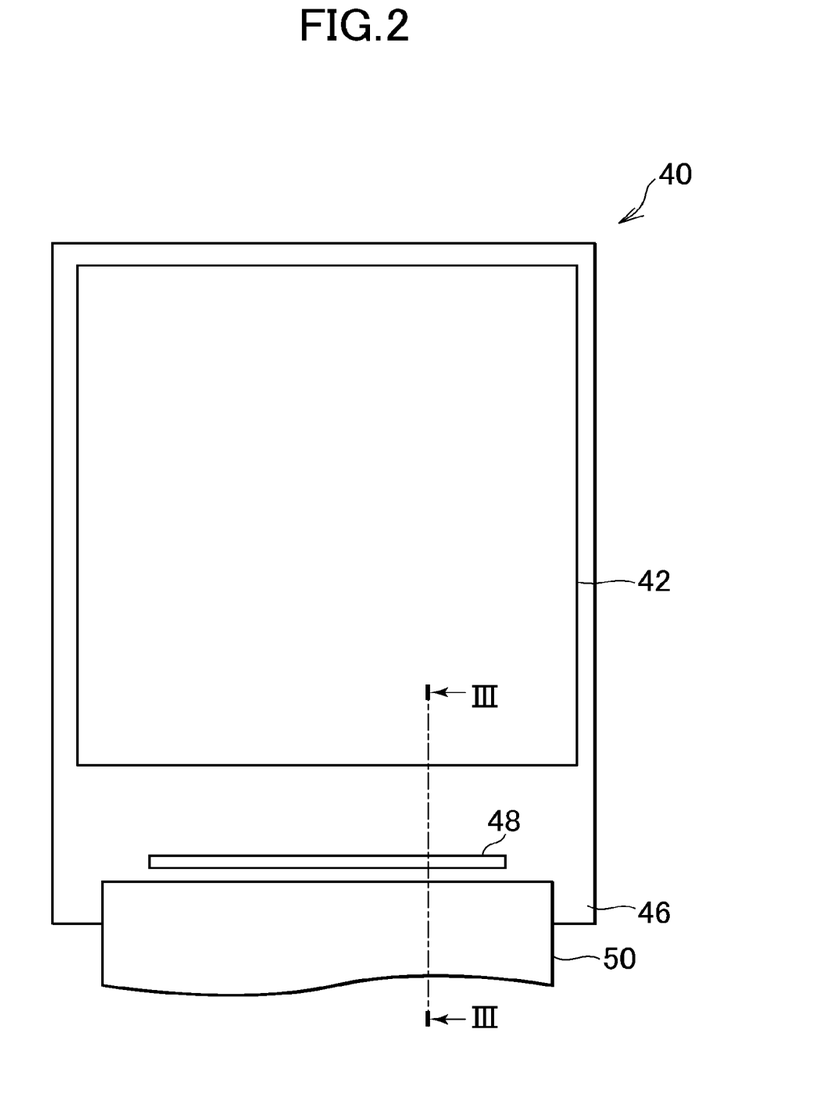
FIG. 2 is a schematic diagram which shows a plan view of an example of a display panel of the organic EL display device shown in FIG. 1.

FIG. 2 is a schematic diagram showing a plan view of an example of the display panel of the organic EL display device shown in FIG. 1. The pixel array part 4 shown in FIG. 1 is provided in a display area 42 of the display panel 40, and as described above the OLEDs 6 are arranged on the pixel array part 4. As described above, the upper electrode which constitutes the OLED 6 is formed so as to be shared in common by the respective pixels and covers all of the display area 42.

On one side of the display panel 40 which has a rectangular shape, a component mounting area 46 is provided, and a wiring connected to the display area 42 is disposed thereon. Further, on the component mounting area 46, a driver IC 48 which constitutes the driving part is mounted, and a flexible printed circuit (FPC) 50 is connected to the component mounting area 46. The FPC is connected to the control unit 26, and other circuits 20, 22, and 24, and the like, and an IC is mounted on the FPC 50.

Figure 3:
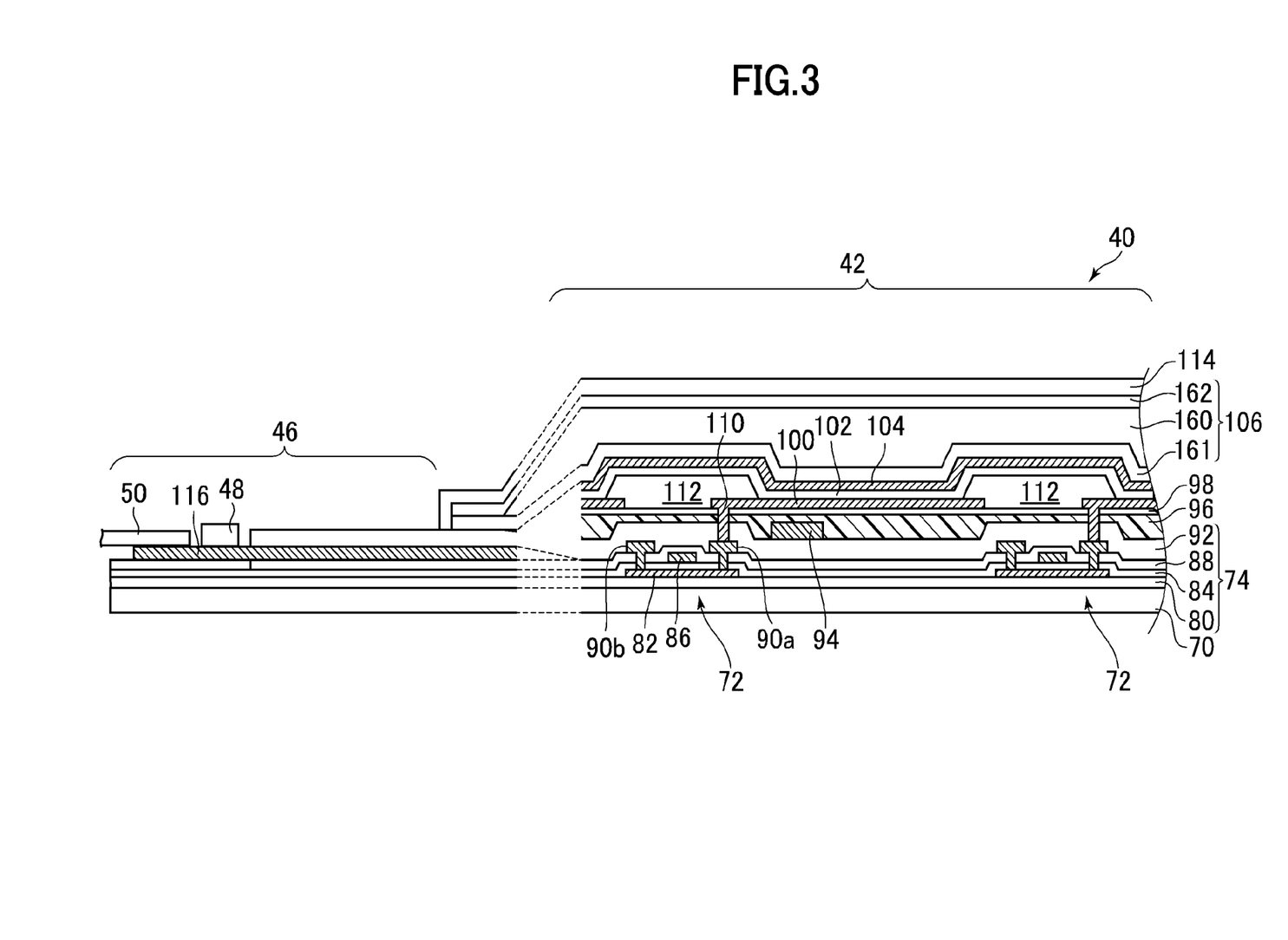
FIG. 3 is a diagram which shows an example of III-III cross section of FIG. 2.

FIG. 3 is a diagram which shows an example of III-III cross section of FIG. 2. The display panel 40 has, for example, a structure that a circuit layer 74 in which TFT 72 and the like are formed, the OLED 6, a sealing layer 106 which seals the OLED 6, and the like are laminated on a base material 70 having flexibility. The base material 70 having flexibility is constituted by, for example, a resin film containing resin such as polyimide resin. In this case, the base material 70 is formed by, for example, applying a resin material to thereby form a film. On the sealing layer 106, a protection film 114 is laminated. Specifically, the protection film 114 which is sheet-like or film-like is bonded onto the sealing layer 106 with an interposition of an adhesion layer.

In the present embodiment, the pixel array part 4 is a top emission type pixel array, and light generated in the OLED 6 is emitted to a side opposite from a side on which the base material 70 exists (in an upper direction in FIG. 3). Note that in the case where a color filter method is adopted as the colorization method of the organic EL display device 2, a color filter is disposed, for example, between the sealing layer 106 and the protection film 114, or on a side on which an opposition base material (not shown) exists. By having white light generated in the OLED 6 go through this color filter, lights in colors such as red (R), green (G), and blue (B) are generated.

In the circuit layer 74 of the display area 42, the pixel circuit 8, the scan signal line 28, the image signal line 30, and the driving electric power source line 32 which have been described above, and the like are formed. At least a part of the driving part can be formed as a circuit layer 74 in an area adjacent to the display area 42, on the base material 70. As described above, the driver IC 48 which constitutes the driving part and the FPC 50 can be connected to a wiring 116 of the circuit layer 74 in the component mounting area 46.

As shown in FIG. 3, on the base material 70, an under-layer 80 which is formed of an inorganic insulating material is disposed. As the inorganic insulating material, for example, silicon nitride ($SiN_y$), silicon oxide ($SiO_x$), or a complex of these is used.

In the display area 42, with an interposition of the under-layer 80, a semiconductor area 82 to be a channel part and the source/drain part of the top gate type TFT 72 is formed on the base material 70. The semiconductor area 82 is formed of, for example, polysilicon (p-Si). The semiconductor area 82 is formed by, for example, providing a semiconductor layer (a p-Si film) on the base material 70, patterning this semiconductor layer, and selectively leaving parts which are used in the circuit layer 74.

On the channel part of the TFT 72, a gate electrode 86 is disposed with an interposition of a gate insulating film 84. The gate insulating film 84 is typically formed of TEOS. The gate electrode 86 is formed by, for example, patterning a metal film formed by sputtering or the like. On the gate electrode 86, an interlayer insulating layer 88 is disposed so as to cover the gate electrode 86. The interlayer insulating layer 88 is formed of, for example, the inorganic insulating material as described above. Into the semiconductor area 82 (p-Si) to be the source/drain part of the TFT 72, impurities are introduced by an ion injection, and further a source electrode 90a and a drain electrode 90b which are electrically connected thereto are formed, and thus the TFT 72 is configured.

On the TFT 72, an interlayer insulating film 92 is disposed. On the surface of the interlayer insulating film 92, a wiring 94 is disposed. The wiring 94 is formed by, for example, patterning a metal film formed by sputtering or the like. With the metal film which forms the wiring 94 and a metal film which is used to form the gate electrode 86, the source electrode 90a, and the drain electrode 90b, the scan signal line 28, the image signal line 30, and the driving electric power source line 32 which are shown in FIG. 1, and the wiring 116, for example, can be formed as a multilayer wiring structure. On these, a planarizing film 96 and a passivation film 98 are formed, and in the display area 42, the OLED 6 is formed on the passivation film 98. The planarizing film 96 is formed of, for example, a resin material. The passivation film 98 is formed of, for example, an inorganic insulating material such as $SiN_y$.

The OLED 6 includes a lower electrode 100, an organic material layer 102, and an upper electrode 104. The OLED 6 is formed typically by laminating the lower electrode 100, the organic material layer 102, and the upper electrode 104 in this order from the side on which the base material 70 exists. In the present embodiment, the lower electrode 100 is an anode of the OLED 6, and the upper electrode 104 is a cathode.

If the TFT 72 shown in FIG. 3 is the driving TFT 12 having n-channels, the lower electrode 100 is connected to the source electrode 90a of the TFT 72. Specifically, after the formation of the planarizing film 96 as described above, a contact hole 110 for connecting the lower electrode 100 to the TFT 72 is formed, and for example, by patterning a conductor part formed on the surface of the planarizing film 96 and inside the contact hole 110, the lower electrode 100 connected to the TFT 72 is formed for each pixel. The lower electrode 100 is formed of, for example, transparent metal oxide such as ITO (Indium Tin Oxide) and IZO (Indium Zinc Oxide), and metal such as Ag and Al.

On the structure as described above, a bank 112 which separates the pixels is disposed. For example, after the formation of the lower electrode 100, the bank 112 is formed at a border of the pixels, and in an effective area of a pixel surrounded by the bank 112 (an area where the lower electrode 100 is exposed), the organic material layer 102 and the upper electrode 104 are laminated. The organic material layer 102 typically includes a plurality of layers. Specifically, the organic material layer 102 is formed by laminating a hole transport layer, a light emission layer, and an electron transport layer in this order from the anode electrode side. Further, the organic material layer 102 may include another layer. As the other layer, for example, a hole injection layer and an electron block layer which are disposed between the anode electrode and the light emission layer, and an electron injection layer and a hole block layer which are disposed between the cathode electrode and the light emission layer can be mentioned. The upper electrode 104 is constituted by a transparent conductive film. The transparent conductive film is formed of, for example, an ultra-thin alloy of Mg and Ag and/or transparent metal oxide such as ITO and IZO.

On the upper electrode 104, a sealing layer 106 is disposed so as to cover all of the display area 42. The sealing layer 106 has a lamination structure which includes a first sealing film 161, a sealing-planarizing film 160, and a second sealing film 162 in this order. The first sealing film 161 and the second sealing film 162 are formed of an inorganic material (e.g., an inorganic insulating material). Specifically, it is formed by forming an $SiN_y$ film by the chemical vapor deposition (CVD) method. The sealing-planarizing film 160 is formed using an organic material (e.g., a resin material such as a curable resin composition). Meanwhile, in the component mounting area 46, the sealing layer 106 is not disposed.

For example, in order to secure mechanical strength of the surface of the display panel 40, the protection film 114 is laminated on the surface of the display area 42. Meanwhile, the protection film 114 is not provided in the component mounting area 46 so that an IC and an FPC can be easily connected thereto.

Figure 4A:
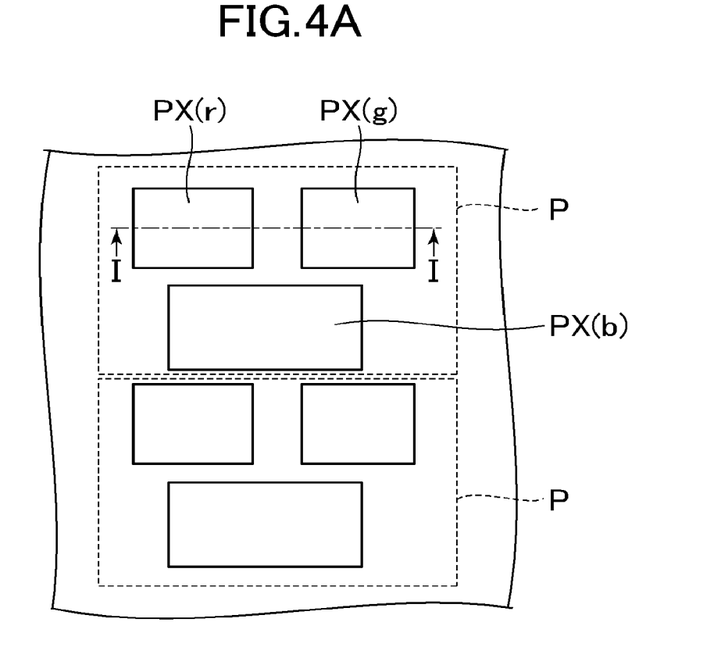
FIG. 4A is a diagram which shows an example of an arrangement of pixels of the display panel shown in FIG. 3.
Figure 4B:
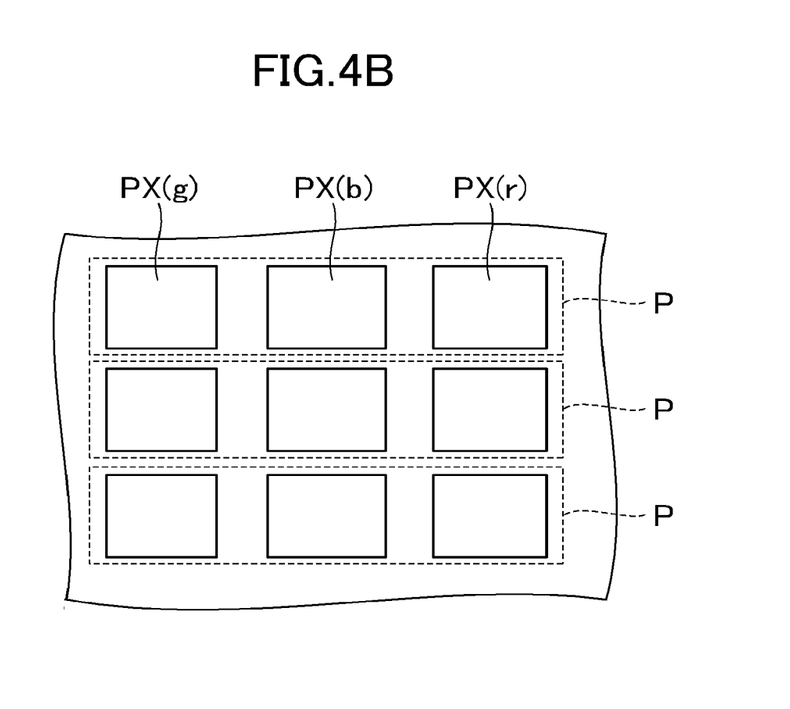
FIG. 4B is a diagram which shows a variation example of an arrangement of pixels of the display panel shown in FIG. 3.

As described above, the display panel 40 has a plurality of pixels PX arranged to be lined up in a horizontal direction and in a vertical direction in its display area 42. In one example, as shown in FIG. 4A, a unit array P of the pixels PX is constituted by a red pixel PX(r), a green pixel PX(g), and a blue pixel PX(b), and the blue pixel PX(b), the red pixel PX(r), and the green pixel PX(g) are disposed on the lower center, the upper left, and the upper right, respectively. There is no particular limitation on the arrangement of the plurality of pixels which constitute the unit array P. For example, as shown in FIG. 4B, the pixels PX which constitute the unit arrays P may be arranged to be lined up in the horizontal direction (in one row). Further, in the case where the unit array P is constituted by four pixels PX, the four pixels PX may be arranged in two rows and two columns.

Figure 5:
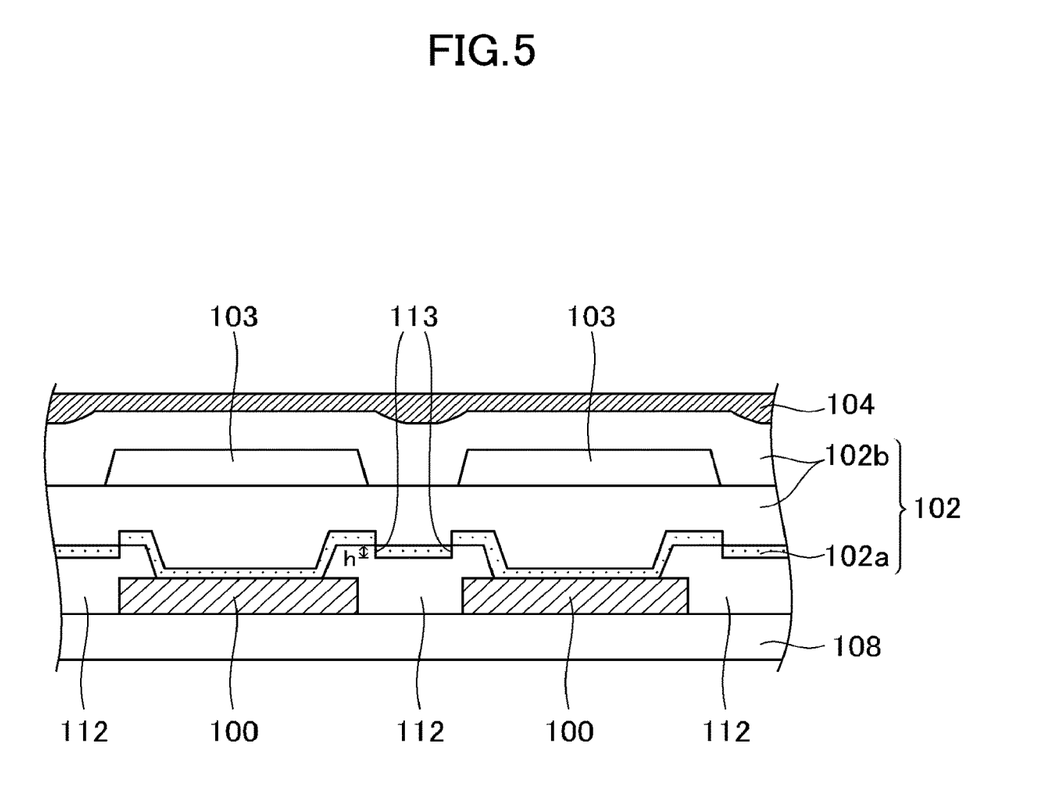
FIG. 5 is an enlarged cross sectional diagram which shows an example of an area near a bank of the display panel shown in FIG. 3.

FIG. 5 is an enlarged cross sectional diagram showing an example of an area near the bank of the display panel shown in FIG. 3, and is a diagram corresponding to I-I cross section of FIG. 4A. Note that in FIG. 5, the structure disposed under the lower electrode 100 shown in FIG. 3 is shown in a simplified manner as a lower structure layer 108, and the structure disposed over the upper electrode 104 is omitted.

The bank 112 is a component which electrically separates the lower electrodes 100 provided in accordance with the respective pixels PX from one another, and is formed so as to cover a periphery of the lower electrode 100 from its upper surface to its lateral surface. The bank 112 is typically formed using an organic insulating material (e.g., a resin material such as a photosensitive resin composition). The lateral surface of the bank 112 has a slope which is inclined toward the lower structure layer 108 (the base material 70) as it extends toward the lower electrode 100. On the central part of the upper surface of the bank 112, a level difference part 113 is formed. In the present embodiment, the level difference part 113 is a recess of the upper surface of the bank 112.

The organic material layer 102 (which does not necessarily include the light emission layer 103) and the upper electrode 104 are provided so as to be shared in common by the respective pixels PX. The organic material layer 102 is provided not only on the upper surface of the lower electrode 100 but also on the bank 112, and is provided continuously from the upper surface of the lower electrode 100 to the lateral surface of the bank 112. Usually, the respective layers which constitute the organic material layer 102 is sequentially formed by a coating method such as the spin coat method and the evaporation method. By forming the organic material layer 102 on the bank 112 having the level difference part 113, the level difference part 113 can divide or substantially divide some layer included in the organic material layer 102, and can suppress a current leakage which occurs between the pixels PX which are adjacent to one another. Therefore, the current leakage can be suppressed while keeping the manufacturing efficiency to be high, as compared to the embodiment in which the organic material layer 102 is formed one-by-one for (is separately applied to) each of the pixels PX. Further, by dividing or substantially dividing some layer included in the organic material layer 102 on the upper surface of the bank 112, an opened state of the bank 112 (a light emitting efficiency) can be secured while suppressing the current leakage.

The height h of the level difference part 113 formed on the upper surface of the bank 112 (the depth of the bottom of the level difference part 113 measured from a reference point taken at the upper surface of the bank 112) is, for example, 1 nm to 100 nm. For example, the level difference part 113 is formed so that its height is smaller than the thickness of the lower electrode 100.

As the lowermost layer of the organic material layer 102 (a layer on the side on which the lower electrode 100 exists), a hole injection layer 102a is provided. The hole injection layer 102a is formed of, for example, an allylamine-based material. The thickness of the hole injection layer 102a is, for example, 1 nm to 60 nm. Here, it is configured that the height h of the level difference part 113 is approximately the same as the thickness of the hole injection layer 102a (e.g., 1 nm to 60 nm). As in the illustrated example, the hole injection layer 102a is preferably divided at the level difference part 113, but may also be in a substantially divided state. The substantially divided state refers to, for example, a state where the hole injection layer 102a has, at the level difference part 113, a thin part whose thickness is less than the thickness of the hole injection layer 102a at a position at which the hole injection layer 102a faces the lower electrode 100, and the resistance is high at this thin part. In consideration of the hole injection, it is difficult to use, for the hole injection layer 102a in contact with the lower electrode 100, a material which has a high resistance, and a current leakage easily occurs between the pixels PX adjacent to one another. By dividing or substantially dividing the hole injection layer 102a like this, the current leakage can be effectively suppressed. In order to divide or substantially divide the hole injection layer 102a, the height h of the level difference part 113 is preferably one tenth or more, and more preferably one half or more of the thickness of the hole injection layer 102a at the position at which the hole injection layer 102a faces the lower electrode 100. On the other hand, the height h of the level difference part 113 is preferably 1.5 times or less, more preferably 1.2 times or less, and particularly preferably 1.1 times or less of the thickness of the hole injection layer 102a at the position at which the hole injection layer 102a faces the lower electrode 100.

Typically, the hole transport layer is disposed on the hole injection layer 102a. The hole transport layer is formed of a material, such as 4,4'-Bis[N-(naphtyl)-N-phenyl-amino]biphenyl (alpha-NPD) and N,N'-bis(3-methylphenyl)-(1,1'-biphenyl)-4,4'-diamine (TPD). The thickness of the hole transport layer is, for example, 50 nm to 200 nm. In one embodiment, the height h of the level difference part 113 is determined so that the hole transport layer would not be divided (which includes the case where the hole transport layer is not divided substantially). According to such embodiment, the division of the cathode positioned on the hole transport layer by the level difference part 113 can be prevented. Preferably the height h of the level difference part 113 is less than the thickness of the hole transport layer. That is because, for example, the hole injection layer 102a can be divided selectively or divided substantially by the level difference part 113.

The other part 102b (the part of the organic material layer 102 not included the "some layer") of the organic material layer 102 is extended over more than one pixels PX. Examples of a layer which constitutes the other part 102b include the hole transport layer, the electron block layer, the hole block layer, the electron transport layer, and the electron injection layer. The other part 102b of the organic material layer 102 is extended over more than one pixels without being divided, and hence the division and cracking of the upper electrode 104 disposed on the organic material layer 102 can be prevented.

Figure 6:
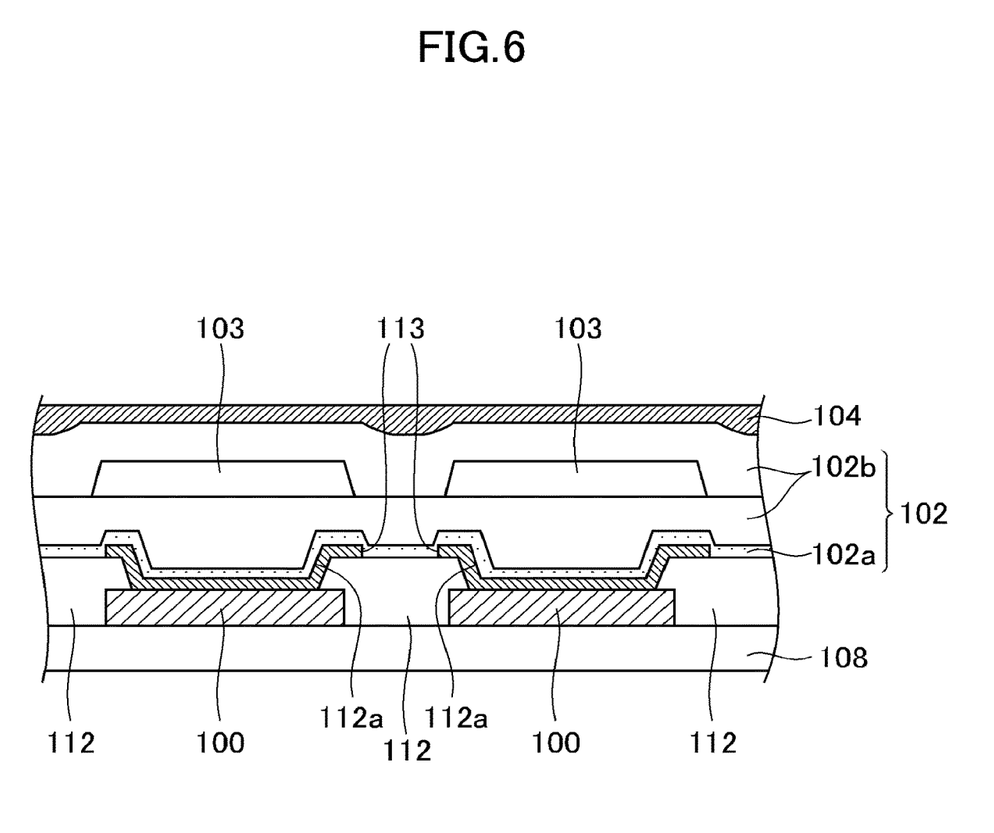
FIG. 6 is an enlarged cross sectional diagram which shows a variation example of the area near the bank of the display panel shown in FIG. 3.

FIG. 6 is an enlarged cross sectional diagram which shows a variation example of the area near the bank of the display panel shown in FIG. 3. Note that in FIG. 6, the structure disposed under the lower electrode 100 shown in FIG. 3 is shown in a simplified manner as the lower structure layer 108, and the structure disposed over the upper electrode 104 is omitted.

In the embodiment as described above, the level difference part 113 is a recess of the upper surface of the bank 112, but in the present variation example, the level difference part 113 is formed by partially providing the conductive film 112a on the bank 112 whose upper surface is flat, and is formed by the upper surface of the bank 112 and the conductive film 112a. The conductive film 112a is formed so as to directly contact the lower electrode 100, and face a part of the upper surface and the lateral surface (the slope) of the bank 112. The conductive film 112a is formed so as to cover an area from the lower electrode 100 to the periphery of the bank 112, but is not formed on the central part of the upper surface of the bank 112.

As a formation material of the conductive film 112a, for example, metal such as aluminum and silver, or transparent metal oxide such as ITO and IZO is used. The thickness of the conductive film 112a can correspond to the height of the level difference part 113 as described above. In one embodiment, the height of the level difference part 113 is set depending on the degree of transparency of the formation material of the conductive film 112a. As a specific example, if the conductive film 112a is a metal film, the height of the level difference part 113 is preferably 10 nm or less.

In the illustrated example, the hole injection layer 102a at the level difference part 113 is thinner than the hole injection layer 102a at the position at which it faces the lower electrode 100 and has a high resistance, but similarly to the embodiments as described above the hole injection layer 102 may be divided.

The present invention is not limited to the embodiments as described above, and various types of variations can be made. For example, a replacement with a configuration which is substantially the same as the configuration shown in the embodiments as described above, a configuration which exhibits the same technical effect, or a configuration which can attain the same objective can be made.

It is understood that without departing from the spirit of the present invention, those skilled in the art can arrive at various types of variations and modifications, and such variations and modifications belong to the scope of the present invention. For example, each of the embodiments as described above to which addition, deletion, or design change of components, or addition, omission, or condition change of processes is suitably applied by those skilled in the art are also encompassed within the scope of the present invention as long as they fall within the spirit of the present invention.

What is claimed is:

1. An organic EL display device comprising:
   a base material;
   a plurality of pixels on the base material;
   a lower electrode which each of the plurality of pixels is provided with;
   an organic insulation layer which sections the plurality of pixels;
   an organic material layer on the lower electrode and the organic insulation layer, the organic material layer including a plurality of layers; and
   an upper electrode on the organic material layer, wherein a level difference part is positioned on an upper surface of the organic insulation layer so as to form a recess part at the upper surface, a first layer included in the organic material layer is divided at the level difference part, or has a thin part being thinner at the level difference part than at a position at which the first layer faces the lower electrode, a second layer included in the organic material layer which is different from the first layer is not divided at the level difference part, and a height of the level difference part is smaller than a thickness of the lower electrode.

2. The organic EL display device according to claim 1, wherein the recess part is a portion where a part of the upper surface is recessed toward the base material.

3. The organic EL display device according to claim 1, wherein the organic insulation layer exposes a part of the lower electrode, and has a slope which intersects the part of the lower electrode and the upper surface, between the organic material layer and the organic insulation layer, a conductive film faces a part of the upper surface and the slope, and the level difference part is formed by the conductive film and the upper surface.

4. The organic EL display device according to claim 3, wherein the conductive film includes metal.

5. The organic EL display device according to claim 4, wherein the conductive film includes transparent metal oxide.

6. The organic EL display device according to claim 3, wherein the conductive film contacts the part of the lower electrode.

7. The organic EL display device according to claim 1, wherein in the first layer included in the organic material layer, a resistance of the thin part at the level difference part is higher than a resistance of the first layer at a position at which the first layer faces the lower electrode.

8. The organic EL display device according to claim 1, wherein the first layer included in the organic material layer includes a hole injection layer.

9. The organic EL display device according to claim 8; wherein a height of the level difference part is one tenth or more of a thickness of the hole injection layer at a position at which the hole injection layer faces the lower electrode.

10. The organic EL display device according to claim 1, wherein the second layer included in the organic material layer includes a hole transport layer, and is extended over the plurality of pixels.

11. The organic EL display device according to claim 10, wherein a height of the level difference part is less than a thickness of the hole transport layer outside the recess part.

* * * * *